United States Patent [19]
Kondo et al.

[11] Patent Number: 5,025,230
[45] Date of Patent: Jun. 18, 1991

[54] OSCILLATOR CIRCUIT INCORPORATED IN A SEMICONDUCTOR CIRCUIT

[75] Inventors: Hitoshi Kondo, Yokohama; Hiroyuki Suwabe, Odawara; Aiki Kojima, Yamato, all of Japan

[73] Assignee: Kabushiki Kaisha Toshiba, Kawasaki, Japan

[21] Appl. No.: 524,017

[22] Filed: May 16, 1990

[30] Foreign Application Priority Data

May 17, 1989 [JP] Japan .................. 1-123762

[51] Int. Cl.$^5$ .............................................. H03B 5/36
[52] U.S. Cl. ............................................ 331/116 FE
[58] Field of Search ........ 331/108 A, 116 R, 116 FE, 331/117 R, 117 FE, 158

[56] References Cited
U.S. PATENT DOCUMENTS 4,918,408  4/1990  Sakihama ................. 331/116 FE X

*Primary Examiner*—Robert J. Pascal
*Attorney, Agent, or Firm*—Finnegan, Henderson, Farabow, Garrett, and Dunner

[57] ABSTRACT

An oscillator circuit incorporated in a semiconductor integrated circuit and comprising an oscillation input terminal, an oscillator output terminal, an inverting logic circuit, and a transmission gate. The terminals and are connected to an external oscillator. The inverting logic circuit comprises an N-type MOS transistor and a P-type MOS transistor. The input and output terminals of the logic circuit are connected to the oscilllation input and output terminals, respectively. The transmission gate comprises an N-type MOS transistor and a P-type MOS transistor. Either MOS transistors has a source electrode and a drain electrode, one of which is connected to said oscillation input terminal, and the other of which is said oscillation output terminal. The gate-insulating film at least one of said MOS transistors incorporatedin the transmission gate is thicker than those of other MOS transistors formed on the semiconductor substrate.

8 Claims, 10 Drawing Sheets

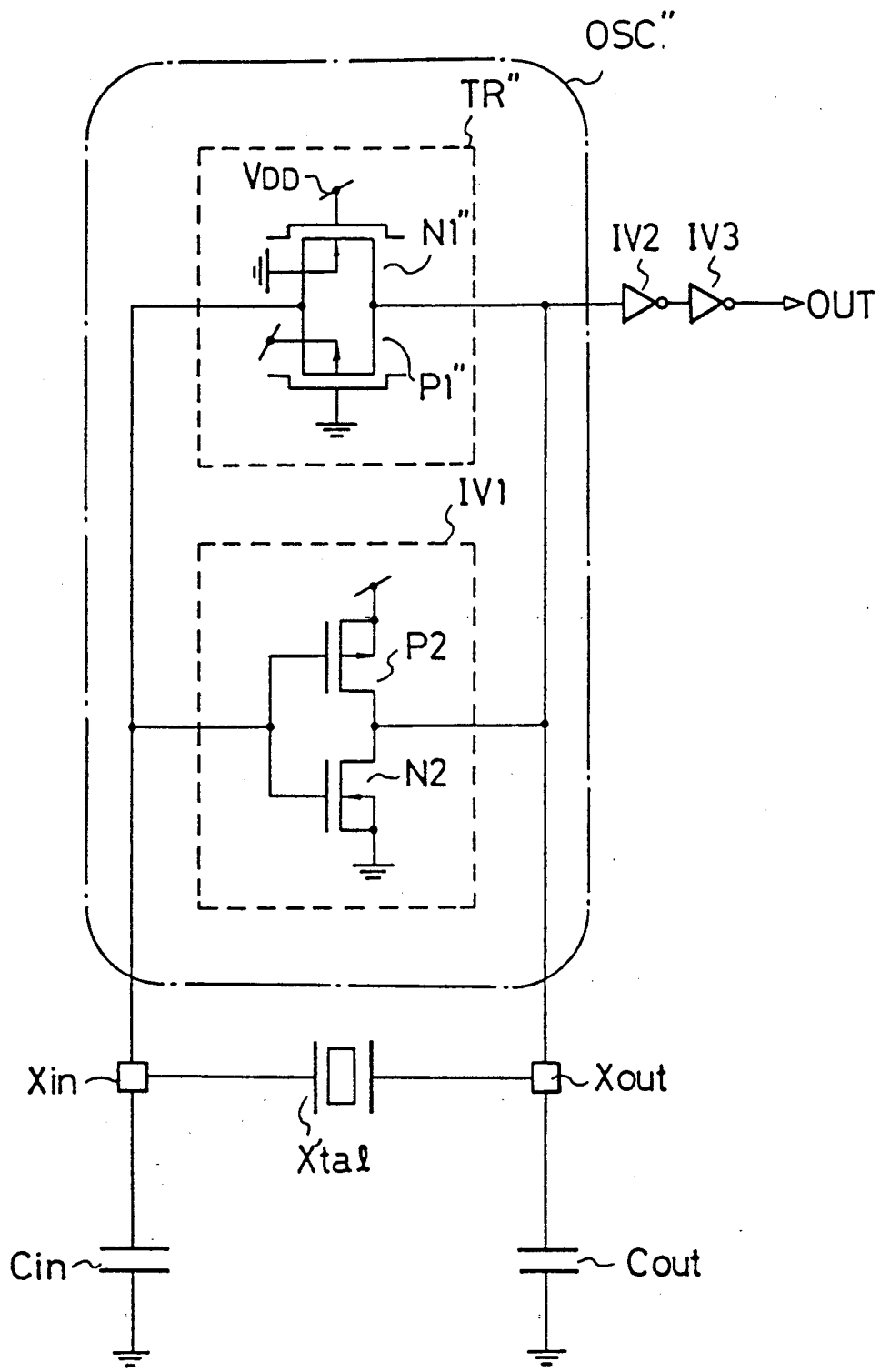
F I G. 1

OSCILLATOR CIRCUIT INCORPORATED IN A SEMICONDUCTOR CIRCUIT

Background of the Invention

1. Field of the Invention

The present invention relates to an oscillator circuit incorporated in a semiconductor IC device, and more particularly to an insulated gate type (MOS) transmission gate for use in a feedback resistor constituting an amplifier circuit.

2. Description of the Related Art

FIG. 6 shows a conventional crystal oscillator circuit (OSC), which is formed on, for example, a p-type semiconductor substrate. The oscillator circuit has an n-type MOS transistor (hereinafter referred to as an N-channel transistor) formed directly on the p-type semiconductor substrate, and a p-type MOS transistor (hereinafter referred to as a P-channel transistor) formed on an n-type well region having a predetermined depth, which in turn is formed in the p-type semiconductor substrate. A ground potential GND is applied to the p-type semiconductor substrate, and a source potential VDD, which is positive with respect to the potential GND, is applied to the n-type well region.

The oscillator circuit OSC has an MOS transmission gate TR and a CMOS inverter IV1.

The transmission gate TR includes a P-channel transistor P1 and an N-channel transistor N1. The gate of the P-channel transistor P1 is connected to GND, and the gate of the N-channel transistor N1 is connected to VDD. One of the source and drain of the P-channel transistor P1, and one of the source and drain of the N-channel transistor N1 are connected to an input terminal Xin. The other one of the source and drain of the P-channel transistor P1, and the other one of the source and drain of the N-channel transistor N1 are connected to an output terminal Xout.

The inverter IV1 includes a P-channel transistor P2 having a source connected to VDD, and an N-channel transistor N2 having a source connected to GND. The gate of the P-channel transistor P2, and that of the N-channel transistor N2 are connected to each other, and also to the input terminal Xin. The drains of the P-channel transistor P2 and the N-channel transistor N2 are connected to each other, and also to the output terminal Xout.

The transmission gate TR is connected to inverters IV2 and IV3 having the same structure as the inverter IV1. The output OUT of the inverter IV3 is the output signal of the crystal oscillator circuit OSC.

The input terminal Xin and the output terminal Xout are connected to an input capacitor Cin and an output capacitor Cout, respectively. A crystal oscillator X'tal is connected between the input terminal Xin and the output terminal Xout. In principle, all elements mentioned above, except the oscillator X'tal, can be incorporated in an semiconductor IC device.

FIG. 7 is a graph representing the resistance characteristic of the transmission gate TR. As is understood from FIG. 7, the resistance characteristic changes with the input voltage, almost linearly, when the transmission gate is in ON state. Since the MOS transistors P1 and P2 are connected as described above, both transistors are always in ON state. Therefore, the transmission gate TR can be regarded as a mere resistor, in terms of its operating behavior. A value approximate to the resistance of the transmission gate TR will be referred to as Rfb.

The relationship between the transmission gate TR and the inverter IV1 will now be described. In FIG. 6, the circuits encircled by broken lines are simple inversion amplifier circuits in which self-bias method is used. Since the output voltage of the inverter IV1 is fed back as an input of the inverter IV1 by resistance Rfb in the self-bias method, the output voltage is equal to the input voltage of the inverter IV1 at an operating point of the amplifier circuit.

FIG. 8 shows the transfer characteristic and operating point of the inversion amplifier circuit. In the self-bias method, it is required that the feedback resistance Rfb be much higher than the output resistance Ro of the inverter IV1, and also that the reciprocal of the product of the input capacitance Cin and the feedback resistance Rfb, i.e., $1/(Cin \times Rfb)$, be much less than the oscillation frequency. The output resistance Ro of the inverter IV1 and a gain Av (Av>0) of the inverter IV1 are parameters relating to oscillation conditions of the crystal oscillator circuit OSC. To clarify conditions determining parameters such as Ro, −Av, Cin, Cout, etc., and conditions determining feedback resistance Rfb, the oscillation conditions of the crystal oscillator circuit OSC will be considered as follows. FIG. 9 illustrates an equivalent circuit of the crystal oscillator circuit OSC shown in FIG. 6. FIG. 9 does not show the feedback resistor Rfb; it shows desired effects only. As is evident from this figure, the operating point of the inversion amplifier circuit shown in FIG. 9 is set to the threshold voltage (for example, VDD/2) of the inverter IV1. In other words, the input terminal of the non-inversion side (+) of the inversion amplifier circuit is set to a potential of VDD/2. To obtain a loop gain of the oscillator circuit OSC shown in FIG. 9, the loop is divided into two paths, the first path extending from the input terminal (1) on the inversion side (−) of the inversion amplifier circuit to the output terminal (2), and the second path extending in the output terminal (2) to the input terminal (1).

First, let us discuss the path extending from the terminal (2) to the terminal (1). Assuming that the voltage at the input terminal (1) is V1 the voltage at the output terminal (2) is V2, the feedback ratio is B, the impedances of the crystal oscillator X'tal, the input capacitor Cin, and the output capacitor Cout are respectively Zx, Zin, and Zout, since V1=B V2, the following equation is obtained:

$$B = Zin/(Zx + Zin) \qquad (1-1)$$

Let us now discuss the path extending from the terminal (1) to the terminal (2). Assuming that the gain of the path (1)-(2) is A, V(2)=A V(1).

$$V_O = -Av V(1) \qquad (1-2)$$

$$V(2) \frac{Z_L}{R_O + Z_L} V_O$$

where $$Z_L = \frac{Zout(Zx + Zin)}{Zx + Zin + Zout} \qquad (1-3)$$

From the equations (1-2) and (1-3), the following equation derives:

$$A = \frac{-AvZ_{out}(Z_x + Z_{in})}{R_O(Z_x + Z_{in} + Z_{out}) + Z_{out}(Z_x + Z_{in})} \quad (1\text{-}4)$$

V(2) increases to A ! & B through the path (2)-(1)-(2). A·B, which is known as "loop gain" of the circuit, is given as:

$$A \cdot B = \frac{-AvZ_{in}Z_{out}}{R_O(Z_x + Z_{in} + Z_{out}) + Z_{out}(Z_x + Z_{in})} \quad (1\text{-}5)$$

Assuming that $Z_{in} = 1/j\omega C_{in}$, $Z_{out} = 1/j\omega C_{out}$, $Z_x = R + jX$, the equation (1-5) reduces to:

$$\begin{aligned} Z_{in} = 1/j\omega C_{in}, Z_{out} = 1/j\omega C_{out}, Z_x = R + jX \\ A \cdot B = -Av - Av/ = (R_G + jX_G) \end{aligned} \quad (1\text{-}6)$$

where $$R_g = 1 - \omega C_{in}X - \omega^2 C_{in}C_{out}RR_O \quad (1\text{-}7)$$

$$X_G = \omega\{(R + R_O)C_{in} + (1 - \omega C_{in}X)C_{out}R_O\} \quad (1\text{-}8)$$

In order to start and continue oscillating, the circuit must be a positive feedback circuit, and the loop gain A·B must be 1 or more. These conditions are expressed as follows:

$$Img(A \cdot B) = 0 \quad (1\text{-}9)$$

$$A \cdot B \geq 1 \quad (1\text{-}10)$$

From the equations (1-8) and (1-9) the following equation is obtained:

$$X_G = 0 \quad (1\text{-}11)$$

$$\therefore 1 - \omega C_{in}X = -\left(1 + \frac{R}{R_O}\right)\frac{C_{in}}{C_{out}}$$

Substituting the equation (111) is substituted into the equation (1-7), and applying the condition of (1-10), we get the following equation:

$$Av \geq \left(1 + \frac{R}{R_O}\right)\frac{C_{in}}{C_{out}} + \omega^2 C_{in}C_{out}RR_O \quad (1\text{-}12)$$

Since R≃r (to be described in detail later) in the vicinity of the oscillation frequency, and r<<Ro in general, the following relation is obtained:

$$Av \geq \frac{C_{in}}{C_{out}} + \omega^2 C_{in}C_{out} \cdot r \cdot R_O \quad (1\text{-}13)$$

From the relation (1-13), the larger the value Av/Ro, the more easily the circuit starts oscillating.

To facilitate the understanding of the above, it is assumed that the N- and P-channel transistors N2 and P2 constituting inverter IV1 have the following relationship in terms of threshold voltage Vth (absolute value), gain coefficients $\beta$, and channel modulation coefficients $\lambda$ thereby to obtain Av, Ro, and Av/Ro.

$$V_{thn} = V_{thp} = V_{th} \text{ (threshold voltage)} \quad (1\text{-}14)$$

$$\beta n = \beta p = \beta(\text{Tr gain coefficient}) \quad (1\text{-}15)$$

$$\lambda n = \lambda p = \lambda(\text{ch. modulation coefficient}) \quad (1\text{-}16)$$

Let Vin and Vout indicate the potential of input terminal Xin and that of output terminal Xout, respectively. As is evident from the equations (1-14) to (1-16), the voltage at the operating point of the inversion amplifier circuit is VDD/2, and the transistors N2 and P2 forming the inverter IV1 are both in saturated operation state. The drain currents Idsn and Idsp of the transistors N2 and P2 are given as:

$$I_{dsn} = \frac{\beta}{2}(V_{in} - V_{th})^2\{1 + \lambda V_{out}\} \quad (1\text{-}17)$$

$$I_{dsp} = \frac{\beta}{2}(VDD - V_{in} - V_{th})^2\{1 + \lambda(VDD - V_{out})\} \quad (1\text{-}18)$$

Gain Av is expressed as follows:

$$Av = |dV_{out}/dV_{in}|, I_{dsn} = I_{dsp} \quad (1\text{-}19)$$

$$Av = \frac{2(VDD + 2/\lambda)}{VDD - 2V_{th}}$$

Output resistance Ro is expressed as follows:

$$R_O = R_n \cdot R_p/(R_n + R_p), 1/R_n = d(I_{dsn})/dV_{out}, - \quad (1\text{-}20)$$
$$1/R_p = d(I_{dsp})/dV_{out}$$

$$R_O = \frac{1}{\beta(VDD/2 - V_{th})^2 \cdot \lambda}$$

Hence, Au/Ro is given as:

$$\frac{Av}{R_O} = \frac{1}{2}\beta(VDD - 2V_{th}) \cdot (VDD \cdot \lambda + 2) \quad (1\text{-}21)$$

As can be understood from the equation (1-21), the values of $\beta$, VDD, and $\lambda$ need to be increased, or the value of Vth needs to be decreased in order to increase the value of Av/Ro, thereby to cause an oscillating operation easily.

When a quartz oscillator circuit OSC is built in an LSI (large scale integrated circuit), the range of VDD is usually predetermined in accordance with the specification of the LSI and, in general, threshold voltage Vth cannot be set to an arbitrary value at the time of designing the LSI. To cause easily the circuit OSC, contained in the LSI, to perform oscillation, the transistor gain coefficient $\beta$ or channel modulation coefficient $\lambda$ needs to be increased.

The transistor gain coefficient $\beta$ is defined as follows:

$$\beta = \mu \cdot \frac{W}{L} \cdot \frac{\epsilon_{SiO_2}}{T_{GATE}} \quad (1\text{-}22)$$

where $\mu$ is mobility of carriers, W is channel width, L is channel length, $\epsilon_{SiO_2}$ is the dielectric constant of $SiO_2$, and $T_{GATE}$ is the thickness of a gate oxide film. Further, correction factor $\{1 + \lambda V_{ds}\}$ of the drain current including $\lambda$ is given, in a physical sense, as follows:

$$\{1 + \lambda V_{ds}\} = \frac{L}{L - L'} \quad (1\text{-}23)$$

where L' is a distance between the drain and the pinch-off point of the channel. L' is expressed by the following equation:

$$L' = \left( \frac{2\epsilon_{SiO2}(Vds - Vgs + Vth)}{q \cdot N} \right)^{\frac{1}{2}}$$

where Vds is the voltage between the drain and source of the transistor, Vgs is the voltage between the gate and source of the transistor, q is charge elementary quantity, and N is the impurity concentration of the substrate. The above equation clearly shows that transistor gain coefficient $\beta$ and channel modulation coefficient $\lambda$ can be increased by reducing the channel length L. The channel length L is, however, limited by the manufacturing process of the LSI, and its minimum value is predetermined. To facilitate an oscillating operation, the channel length L is of the minimum value and, on one hand, channel modulation coefficient $\lambda$ is considered to be a function of voltage. On the other hand, the channel width W is increased, increasing and the transistor gain coefficient $\beta$. In other words, the quartz oscillator circuit should be designed so as to decrease output resistance Ro.

The specification of an LSI usually includes Vsta (oscillation starting power source voltage) which enables the circuit OSC contained in the LSI to achieve oscillation easily, Tsta (oscillation starting time), and Vhold (oscillation continuing power source voltage) which enables the circuit OSC to continue a stable oscillation at low power source voltage. Also, the current Iosc which the LSI consumes when the quartz oscillator circuit OSC operates, is often defined. As is understood from the above, the current Iosc increases the output resistance Ro, whereas the oscillation starting power source voltage Vsta, oscillation starting time Tsta, and oscillation continuing power source voltage Vhold decrease output resistance Ro.

An LSI containing a quartz oscillator circuit OSC having an oscillation frequency of tens of k, which is used in a clock, a pocket calculator, or the like, usually requires consumption current Iosc of several $\mu$A, and thus its output resistance Ro must be in order of M$\Omega$. In designing an LSI circuit, the sizes of elements of an inversion amplifier circuit are determined such that the output resistance Ro is several M$\Omega$ and also that the oscillation starting power source voltage Vsta, the oscillation starting time Tst, and the oscillation continuing power source voltage Vhold have satisfactory values.

In view of the above description and also the first condition of feedback resistance Rfb, that is, the feedback resistance Rfb should be much higher than the output resistance Ro of inverter IV1, an LSI for use in a clock, a pocket calculator, or the like, needs to have feedback resistance Rfb of tens of M$\Omega$.

The second condition for determining the feedback resistance Rfb, that is, the reciprocal, 1/(Cin·Rfb), of the product of the input capacitance Cin and the feedback resistance Rfb is much less than the oscillation frequency, can be satisfied by properly selecting input capacitance Cin in accordance with the oscillation frequency.

The above descriptions are based on the assumption that Rfb=$\infty$. The oscillation characteristic of the quartz oscillator circuit actually used in an LSI is not much influenced by the value of feedback resistance Rfb if the two conditions for determining the feedback resistance Rfb are satisfied.

The conventional quartz oscillator circuit OSC, however, has the following drawback. The circuit OSC, which operates at a relatively low frequency of several tens of kHz, needs a resistor having a high feedback resistance Rfb of tens of M$\Omega$. To reduce a resistorforming area on the LSI chip to the utmost, the resistor must be made of material having a high resistivity. In the CMOS-LSI commonly used, the resistor has a resistivity of only several k$\Omega$ per unit square, at most, if not only a metal wiring layer, but also a conductive polysilicon layer or a high-resistance impurity layer is formed and used as a gate electrode. MOS transistors having a relatively high channel resistance may, therefore, be utilized to form a transmission gate which functions as a feedback resistor. FIG. 6 illustrates a quartz oscillator circuit OSC comprising such a feedback resistor. If the channel conductances of the transistors N1 and P1 of the quartz oscillator circuit OSC are represented by gn and gp, respectively, the conductive resistance, i.e., feedback resistance Rfb is given as follows:

$$Rfb = \frac{1}{gn + gp} \quad (2\text{-}1)$$

Channel conductance g (=gn, gp) is defined as follows:

$$g = \frac{\partial Ids}{\partial Vds} \quad (2\text{-}2)$$

(where Vgs=const.)

Let a difference in potential between both terminals of the transmission gate TR be represented by $\delta V$ (=Vout−Vin$\geq$0), and let us assume that the transistors N1 and P1 are both in a non-saturated state and the same relationships as shown by equations (1-14) to (1-16) are given. Then, the drain currents Idsn and Idsp of the transistors N1 and P1 are expressed by the following equations:

$$Idsn = \beta[\{VDD-(Vout-\delta V)-Vth \cdot \delta v - \tfrac{1}{2}\delta v^2\} \quad (2\text{-}3)$$

$$Tdsp - \beta\}(Vout - Vth) \, \delta v - \tfrac{1}{2}\delta V^2\} \quad (2\text{-}4)$$

where Vth $\leq$ Vin $\leq$ VDD−Vth because of the condition of cutoff. The channel conductances gn and gp at the operating point of the inversion amplifier circuit are as follows:

$$gn = gp = \frac{\beta}{2}(VDD - 2Vth) \quad (2\text{-}5)$$

where $VDD/2 = Vin = Vout$ (the relationship of Vth$\leq$VDD/2$\leq$VDD−Vth is satisfied unless VDD is extremely low). Thus, the conductive resistance (feedback resistance) Rfb is:

$$Rfb = \frac{1}{\beta(VDD - 2Vth)} \quad (2\text{-}6)$$

If the equation (2-6) reduces to the following, by rewriting the current gain $\beta$ based on the equation (1-22):

$$Rfb = \rho c \cdot \frac{L}{W} \quad (2\text{-}7)$$

$$\left( \because \rho c = \frac{T_{GATE}}{\mu \epsilon_{sio2}(VDD - 2Vth)} \right. \quad (2\text{-}8)$$

where $\rho c$ can be considered to be the resistance per unit square which the channel has. Furthermore, L/W is the size factor of a composite element including transistors N1 and P1 connected in parallel. When transistors having element sizes of $W_1/L_1$ and $W_2/L_2$ are connected in parallel, L/W is expressed by the following equation:

$$\frac{L}{W} = \frac{L_1 \cdot L_2}{L_1 W_2 + L_2 W_1} \tag{2-9}$$

In the manufacturing process of a commonly-used CMOS-LSI, the thickness of a gate oxide film $T_{GATE}$ is hundreds of Å, the mobility of carriers $\mu$ is hundreds of cm²/Vsec, and the dielectric constant of $SiO_2$ $\epsilon_{SiO2}$ is in order of $10^{-13}$ F/cm. Since the voltage at the operating point of the inversion amplifier circuit, i.e., the substrate bias of $|VDD/2|$ is applied to the transistors N1 and P1 constituting the transmission gate TR, the threshold voltage Vth is about 1V, as will be describe in detail later.

As may be understood from the formula (2-8), the specific resistance $\rho c$ is tens to hundreds of kΩ in the case of an LSI whose power source potential VDD is 3V. In order to obtain a resistance of several tens of MΩ needed as the feedback resistance Rfb, the value of L/W should be several hundreds to several thousands. Assuming that a transmission gate TR allowing the value of L/W to be 2,000 is formed on an LSI circuit by use of a manufacturing process wherein the minimum channel width and minimum channel length of a transistor are 2 μm, transistors N1 and P1 are required to have a channel length of 8,000 μm. This value is far greater than the element size of the transistors incorporated in an ordinary logic circuit (both the width and length of these transistors are several tens of μm.) In the case of an inverter circuit formed with the minimum element dimensions, therefore, the area occupied by the transmission gate TR will be so wide as to correspond to at least 500 stages.

It will now be explained, in detail, why the resistance component R of the impedance Zx of the crystal oscillator X'tal satisfies the relation R≃r in the vicinity of the oscillation frequency, as mentioned above. FIG. 10A is an equivalent circuit corresponding to the crystal oscillator X'tal. If the oscillation frequency of the oscillator X'tal is 32 KHz, the resistance r is 30 kΩ or so, the inductance L is 11,000H or so, capacitance C is 0.0021 pF or so, and capacitance Co is 0.9 pF or so. As may be understood from the equivalent-circuit diagram, the impedance Zx of the oscillator X'tal can be expressed as follows:

$$Zx = R + jX \tag{3-1}$$

$$R = \frac{-(1 - \omega^2 CL)\omega^2 CoCr - \omega Cr\{\omega^3 CoCL - \omega(Co + C)\}}{\{\omega^2 CoCr\}^2 + \{\omega^3 CoCL - \omega(Co + C)\}^2} \tag{3-2}$$

$$jX = j\frac{(1 - \omega^2 CL)\{\omega^3 CoCL - \omega(Co + C) - \omega^3 CoC^2 r^2\}}{\{\omega^2 CoCr\}^2 + \{\omega^3 CoCL - \omega(Co + C)\}^2} \tag{3-3}$$

Assuming that the resistance component R is negligible, the crystal oscillator X'tal is considered to have reactance X dependent on the frequency. Thus, the equation (3-3) can reduce to:

$$jX = -\frac{j}{\omega Co} \cdot \frac{\omega^2 - \omega s^2}{\omega^2 - \omega p^2} \tag{3-4}$$

provided that:

$$\omega s = \left(\frac{1}{LC}\right)^{\frac{1}{2}} \tag{3-5}$$

$$\omega p = \left\{\frac{1}{L}\left(\frac{1}{C} + \frac{1}{Co}\right)\right\}^{\frac{1}{2}} \tag{3-6}$$

where $\omega s$ is series-resonance angular frequency, and $\omega p$ is parallel-resonance angular frequency. It should be noted that the equation jX=0 holds true if the angular frequency $\omega$ is equal to $\omega s$, and that the equation jX=∞ holds true if the angular frequency $\omega$ is equal to $\omega p$.

FIG. 10B is a graph in which the reactance X of the crystal oscillator X'tal is plotted as a function of the angular frequency $\omega$. The oscillator circuit OSC shown in FIG. 9 is known as "Colpitts oscillator circuit and performs oscillation when the frequency has a value at which the impedance Zx of the crystal oscillator X'tal acts as an inductance reactance, i.e., when $\omega s < \omega < \omega p$.

If the crystal oscillator X'tal is an ordinary type, the relation Co<<C stands true, so that the series-resonance angular frequency $\omega s$ and the parallelresonance angular frequency $\omega p$ are nearly equal to each other. If the oscillator X'tal has an oscillation frequency of 32 kHz, the parallel-resonance angular frequency $\omega p$ is only 0.12% higher than the series-resonance angular frequency $\omega s$. Therefore, the crystal oscillator circuit OSC shown in FIG. 9 is said to have a very small oscillation frequency deviation.

Assuming that the crystal oscillator circuit shown in FIG. 9 is oscillating at the series-resonance angular frequency $\omega s$, the resistance component R can be expressed below, as is apparent from formulas (3-2) and (3-5).

$$R = \frac{r}{1 + \frac{Co^2}{LC} r^2} \simeq r \tag{3-7}$$

where $(Co^2/LC) \times r^2 = 7.9 \times 10^{16} << 1$.

It will now be explained why transistors N1 and P1, which constitute the transmission gate TR, are considered to have a threshold voltage Vth of IV or so, as mentioned above.

In general, the threshold voltage Vth of an MOS transistor is expressed as follows:

$$V_{th} = V_{SiO_2} \quad (4\text{-}1)$$
$$+ V_{FB}$$
$$+ 2\phi_F$$
$$= \frac{T_{GATE}}{\epsilon_{SiO_2}} \sqrt{2\epsilon_{SiO_2} q N_S (2\phi_F + |V_{sub}|)}$$
$$+ \phi_{MS} - \frac{T_{GATE}}{\epsilon_{SiO_2}} \left\{ qN_{SS} + \int_0^{T_{GATE}} \frac{x}{T_{GATE}} \rho_{ox}(x) \, dx \right\}$$
$$+ 2\phi_F$$

where $V_{SiO_2}$ is the voltage applied to the gate oxide film (SiO$_2$), $V_{FB}$ is flat band voltage, $2\phi F$ is the degree to which the band curves in the surface region when an inversion layer is formed, $V_{sub}$ is the potential which the substrate has when the potential at the source of the transistor is used a reference potential, and x is the direction determined with reference to the lower end of the gate electrode and takes a positive value when that direction is toward the surface of the semiconductor substrate.

The meaning of each parameter in the equation (4-1) and a typical value for each parameter are shown below, based on the assumption that the MOS transistor is of an N-channel type.

Ns=$10^{17}$cm$^{-3}$ (impurity concentration in surface region of substrate);

$\phi$F=0.35eV (Fermi potential);

$\phi$MS=$-0.9$eV (work function difference between gate electrode material and semiconductor substrate);

NSS=$10^{11}$ cm$^{-2}$ (surface level density in the interface between the semiconductor substrate and gate oxide film);

$\epsilon$SiO$_2$ =3.5$\times 10^{-13}$ F/cm (dielectric constant of gate oxide film);

T$_{GATE}$=400 Å(thickness of gate oxide film); and q=1.6$\times 10^{-19}$ coulomb (elementary quantity of electric charge).

In the equation (4-1), $\rho_{OX}$ is a function representing how fixed electric charge is distributed in the gate oxide film. The function is dependent on the quality of the gate oxide film. Even if the $\rho_{OX}$ term in the equation (4-1) is ignored, this does not cause a large calculation error, since, in recent years, a gate oxide film is formed of SiO$_2$ which contains a very small amount of impurities and has few structural defects.

In the case of the transistor employed in an ordinary logic circuit, it is possible to assume that the substrate potential Vsub is 0V. Therefore, the threshold voltage Vth is calculated as 0.63V or so (Vth=0.63V), on the basis of formula (4-1). If $|V_{sub}|$=1.5V, as in the case where the above-mentioned transmission gate TR is formed, the threshold voltage Vth is calculated as 1.41V or so (Vth=1.41V).

As mentioned above, the conventional crystal oscillator circuit has the problem that the transmission gate, which provides a feedback resistance and, thus, constitutes an amplifier circuit element for the oscillator circuit, occupies a very large area on the LSI chip, if the transmission gate is to have a resistance as high as tens of MΩ.

SUMMARY OF THE INVENTION

The present invention has been developed to solve the problem mentioned above, and its object is to provide an oscillator circuit wherein a transmission gate, which provides a feedback resistance and therefore constitutes an amplifier circuit element, occupies a small area on an LSI chip.

According to the present invention, there is provided an oscillator circuit which is incorporated in a semiconductor IC device comprising MOS transistors used as active elements. The oscillator circuit comprises an oscillator, an input terminal and an output terminal, both connected to the oscillator, an inverting logic circuit connected between the input terminal and the output terminal, an N-type MOS transistor connected between the input and the output terminals, and a P-type MOS transistor connected between the input and output terminals. The gate of the N-type MOS transistor is connected to a first potential terminal, so that the MOS transistor is conducting. Similarly, the gate of the P-type MOS transistor is coupled to a second potential terminal, so that this MOS transistor is conducting. The N-type MOS transistor or the P-type MOS transistor, or both, have a gate-insulating film thicker than those of the other MOS transistors incorporated in the semiconductor IC device, and therefore have a high channel resistance of a predetermined value.

In the oscillator circuit described above, the N-type MOS transistor or the P-type MOS transistor, or both have a gate-insulating film composed of an insulating film similar to those of the other MOS transistors incorporated in the IC device and an inter-layer insulating film formed on the insulating film, and also have a gate electrode which is a metal conductor layer formed on the inter-layer insulating film.

Since at least one of the MOS transistors forming a transmission gate connected to the inverting logic circuit and used as feedback resistor has a thick gateinsulating film, the channel conductance g of the at least one MOS transistor decreases in reverse proportion to the thickness T$_{GATE}$ of the gate-insulating film, as may be understood from formulas (1-22), (2-5), and (4-1). Hence, the MOS transistor has a high channel resistance of the predetermined value, and, as is evident from formulas (2-7) and (2-8), the feedback resistance Rfb is proportionally high. In other words, this MOS transistor can have a desired channel resistance even if has a small L/W value. Thus, the MOS transistor need not be so large, and the the transmission gate occupies but a small area in the IC device (i.e., LSI chip). This fact by no means impairs the characteristics of the oscillator circuit.

Further, since at least one of the MOS transistor forming the transmission gate has a gate-insulating film composed of an insulating film similar to those of the other MOS transistors incorporated in the IC device and an inter-layer insulating film formed on the insulating film, and also have a gate electrode which is a metal conductor layer formed on the inter-layer insulating film, the gate-insulating film can be thick.

BRIEF DESCRIPTION OF THE DRAWINGS

FIG. 1 shows a structure of an oscillator circuit according to an embodiment of the present invention;

DETAILED DESCRIPTION OF THE PREFERRED EMBODIMENTS

One embodiment of the present invention will now be described in detail, with reference to the accompanying drawings. FIG. 1 shows an oscillator circuit OSC" incorporated in a semiconductor integrated circuit device, an oscillation input terminal Xin, and an oscillation output terminal Xout. FIG. 1 also shows a crystal oscillator X'tal, an input capacitor Cin, and an output capacitor Cout, which are externally connected to the semiconductor integrated circuit device. The crystal oscillator X'tal is connected between the oscillation input terminal Xin and the oscillation output terminal Xout. The input capacitor Cin is connected between the oscillation input terminal Xin and the ground GND; likewise, the output capacitor Cout is connected between the oscillation output terminal Xout and the ground GND. The crystal oscillator X'tal, the input capacitor Cin, and the output capacitor Cout may be incorporated in the semiconductor integrated circuit device, if so desired.

Figure 6:
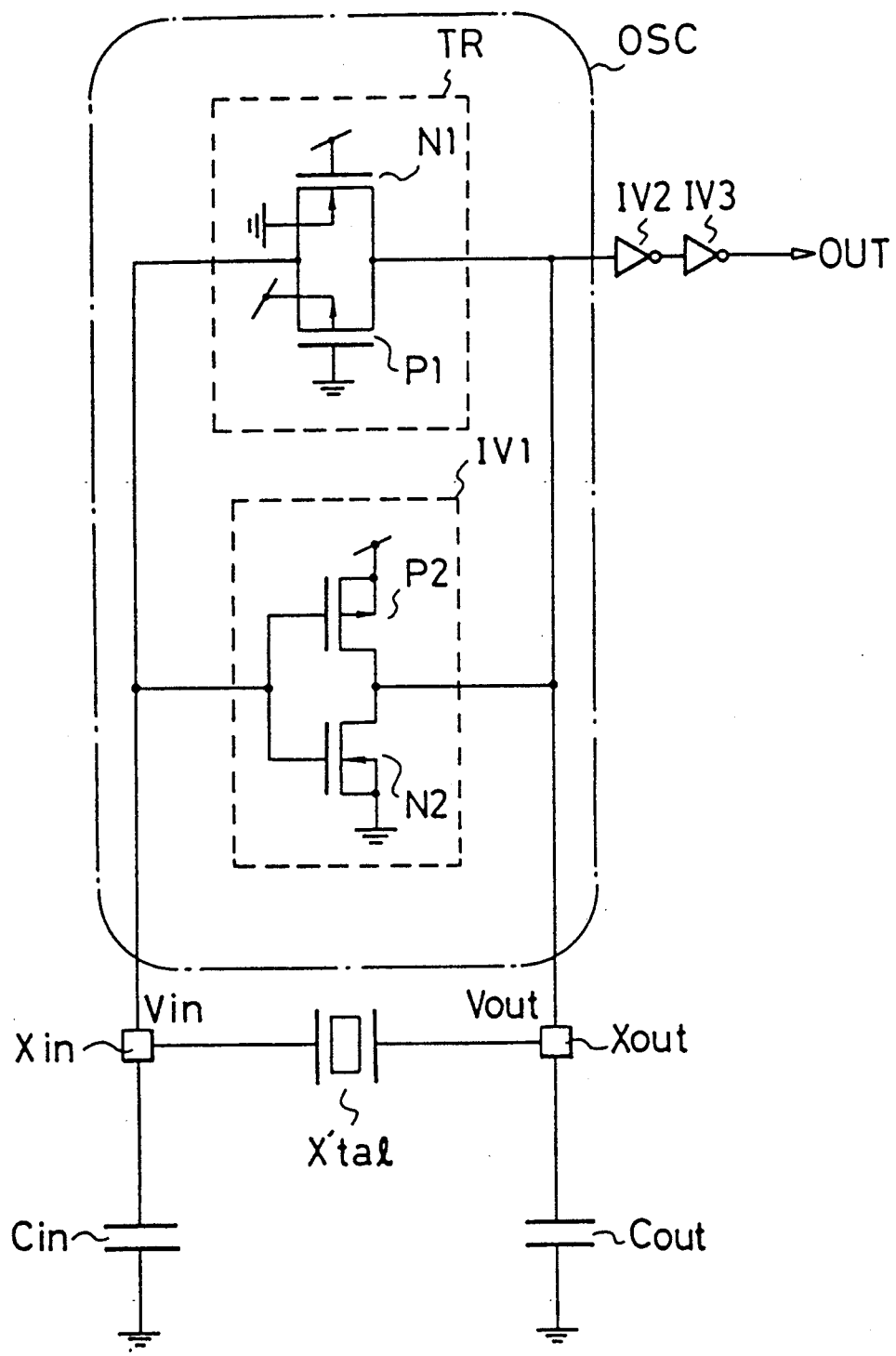
FIG. 6 shows a conventional crystal oscillator circuit.
Figure 7:
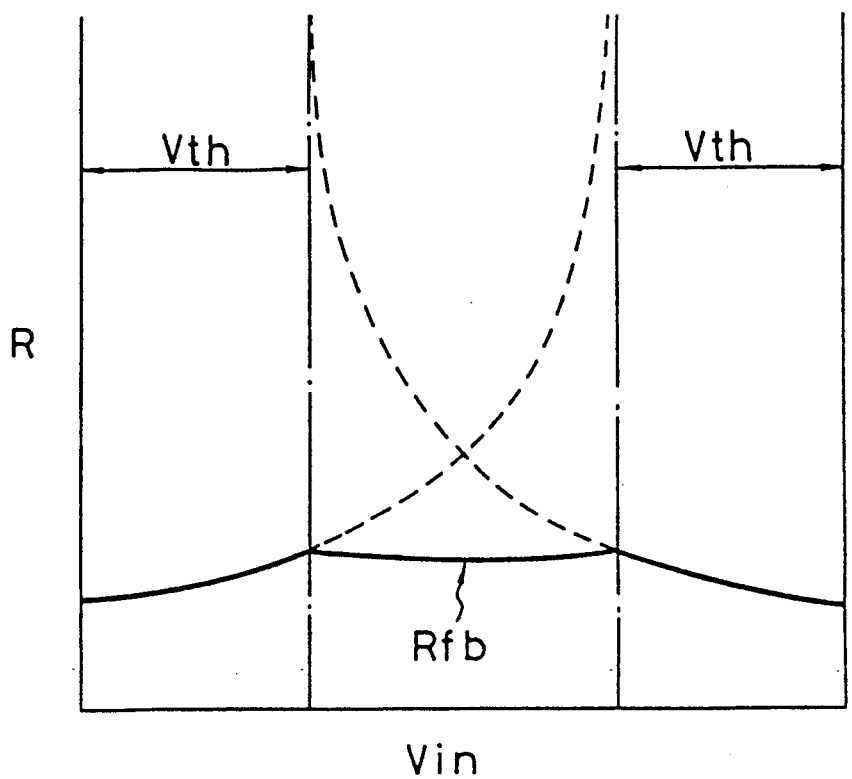
FIG. 7 is a graph showing the resistance characteristics of a transmission gate in the "ON" state, shown in FIG. 6.
Figure 8:
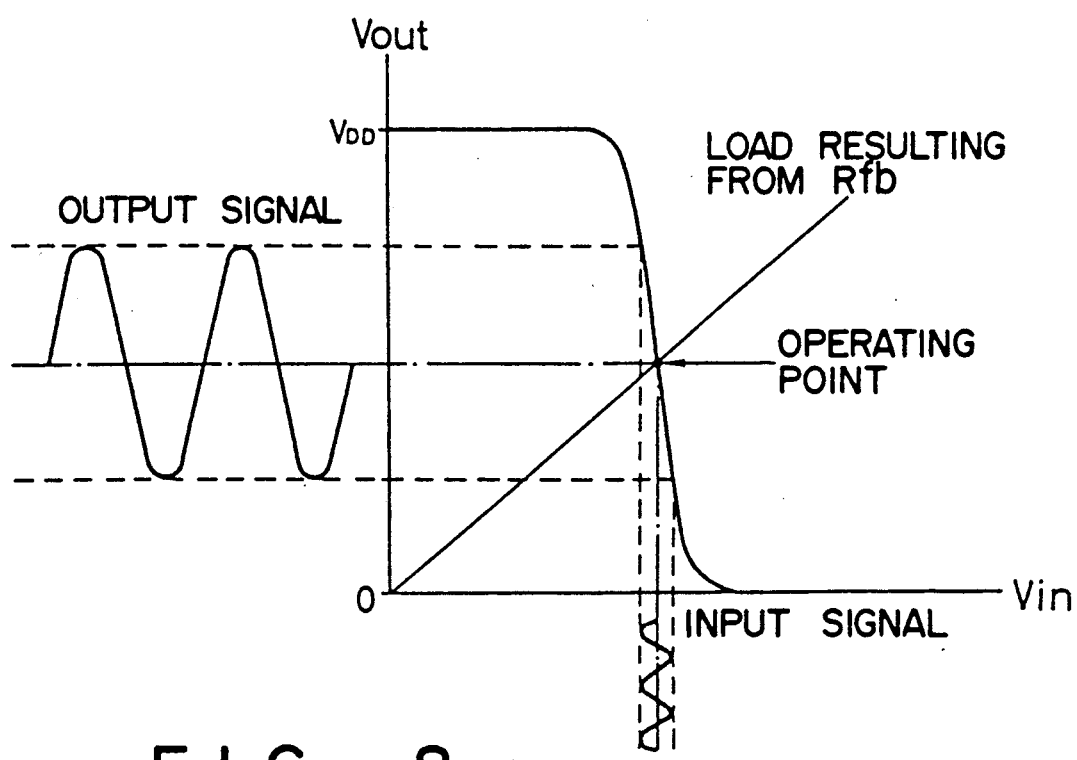
FIG. 8 is a graph showing the transmission characteristic and the operation point of the inversion logic circuit shown in FIG. 6.
Figure 9:
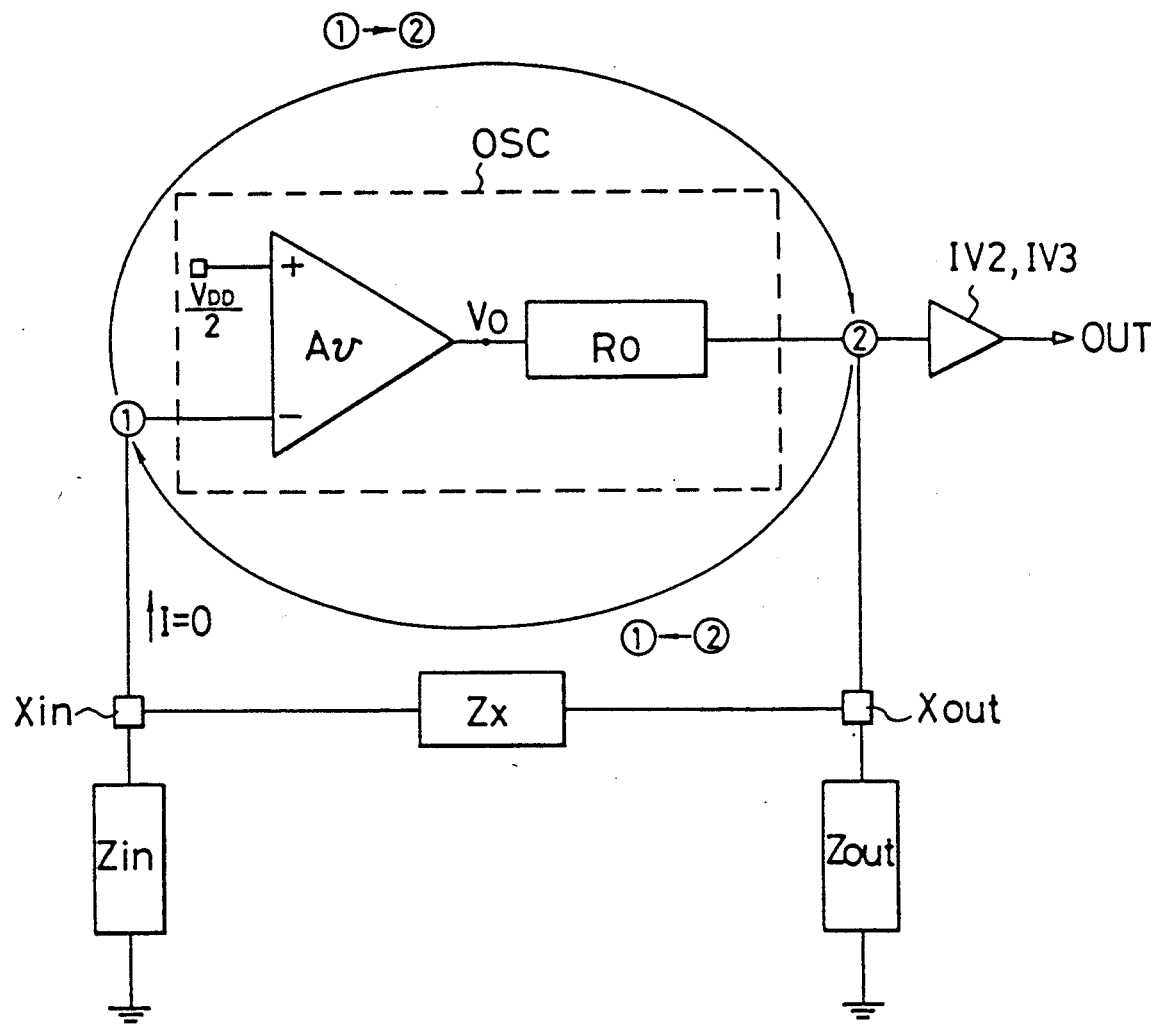
FIG. 9 shows a circuit equivalent to the circuit shown in FIG. 6.
Figure 10A:
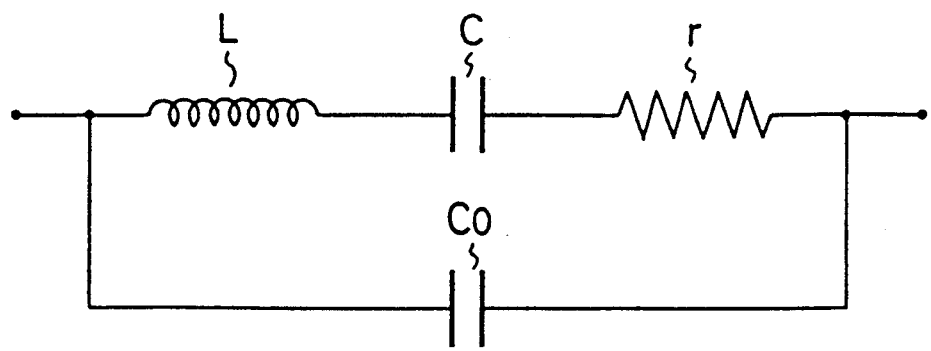
FIG. 10A shows an equivalent circuit of the crystal oscillator.
Figure 10B:
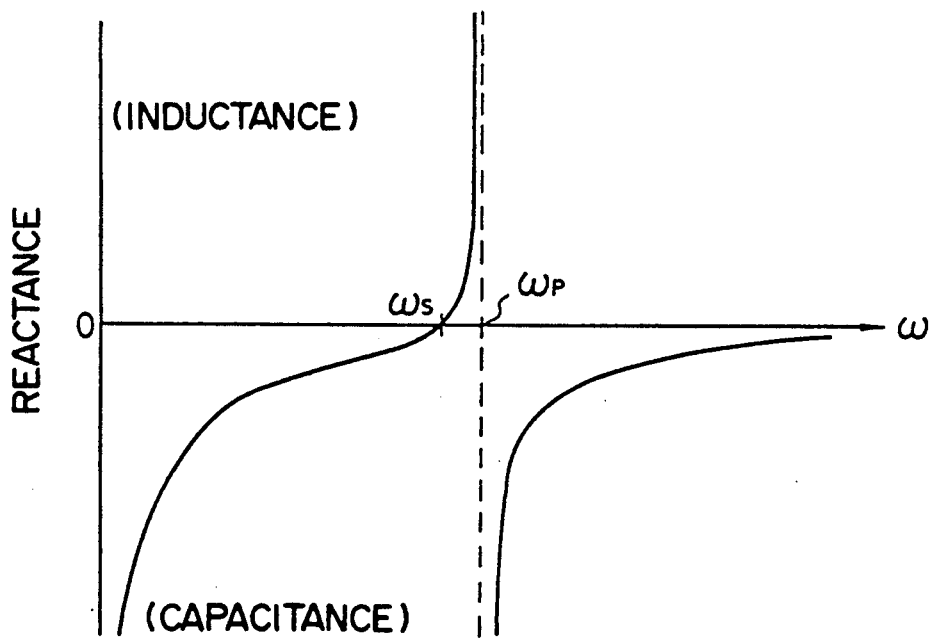
FIG. 10B is a graph showing the reactance characteristics of the crystal oscillator.

The above-mentioned oscillator circuit OSC" differs from the conventional oscillator circuit OSC shown in FIG. 6, in that the gate insulation film (e.g., a gate oxide film) of at least one of transistors N1" and P1" of the transmission gate TR" is thicker than the gate insulation films of the other transistors used in the same semiconductor integrated circuit device. (In the case of the present embodiment, both transistors N1" and P1" have such a thick gate insulation film.) Since the oscillator circuit OSC" is similar to the conventional oscillator circuit OSC" in the other points, the same reference symbols as in FIG. 6 are also used in FIG. 1, to denote the corresponding structural elements. In the circuit diagram shown in FIG. 1, the transistors N1" and P1" are indicated in a different way from that of the other transistors, so as to show that the gate electrode of the transistors N1" and P1" is formed of a different material from that of the other transistors.

Figure 2A:
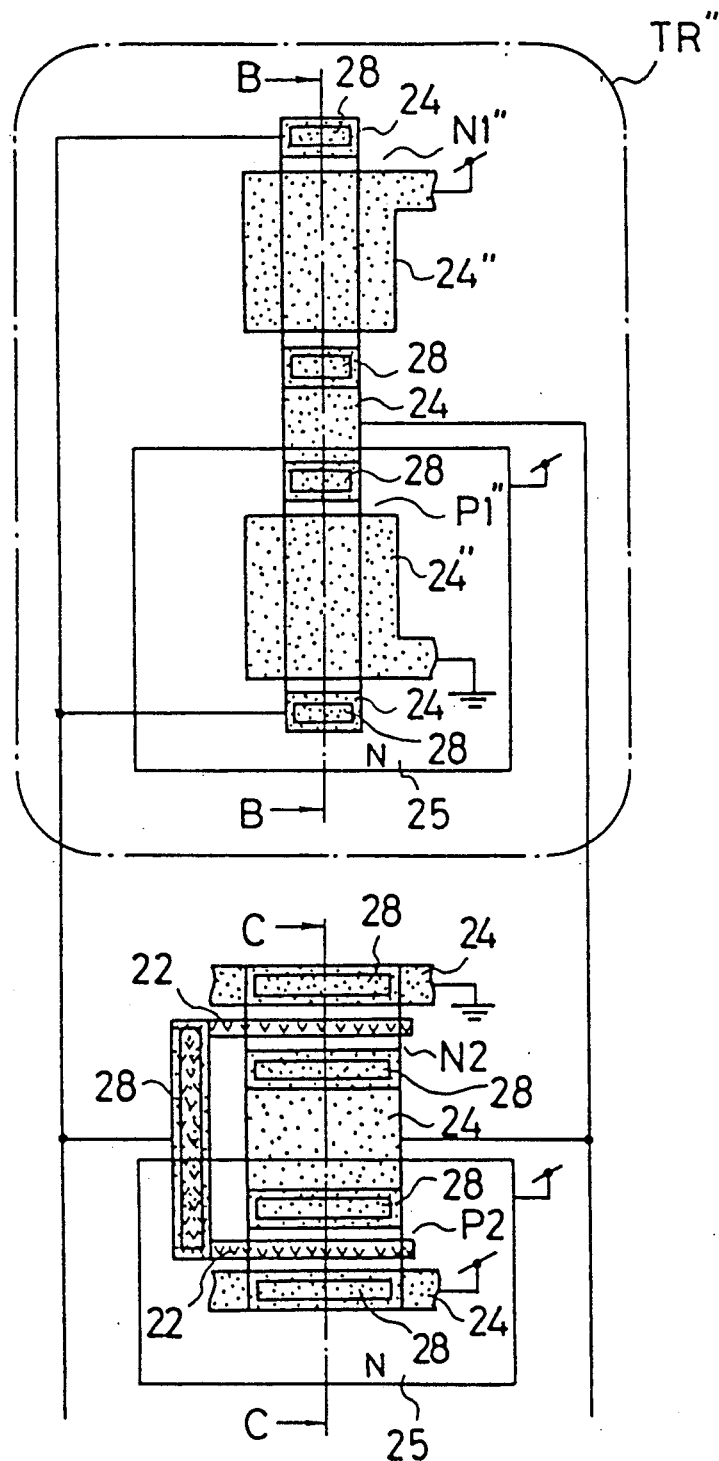
FIG. 2A shows a plan pattern of elements in the oscillator circuit shown in FIG. 1.
Figure 2B:
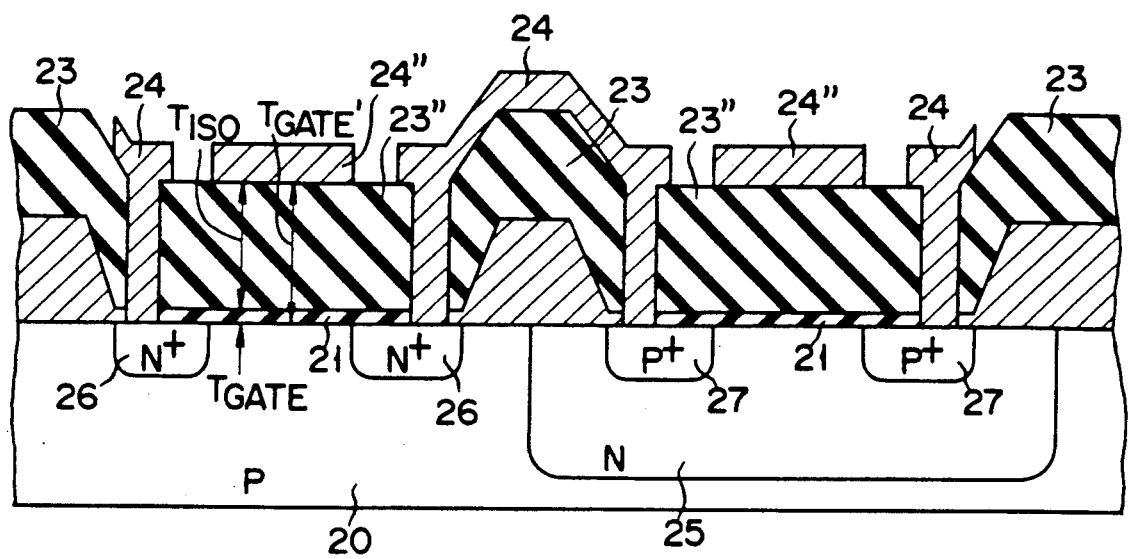
FIG. 2B is a cross-sectional view taken along line B—B in FIG. 2A.
Figure 2C:
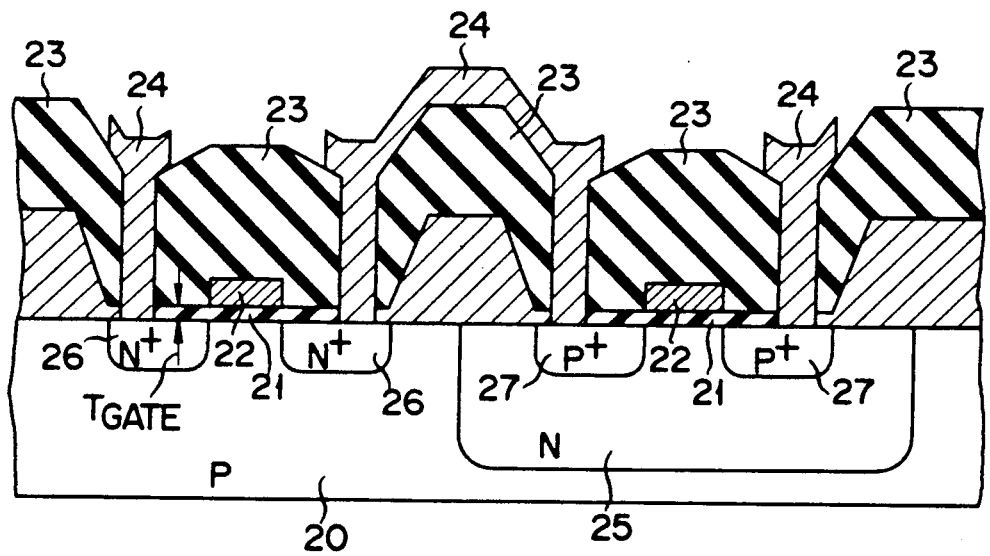
FIG. 2C is a cross-sectional view taken along line C—C in FIG. 2A.

FIG. 2A shows a planar pattern of the element of the oscillator circuit OSC" illustrated in FIG. 1. FIG. 2B is a sectional view taken along line B—B in FIG. 2A and shows a sectional structure of the transmission gate TR". FIG. 2C is a sectional view taken along line C—C in FIG. 2A and shows a sectional structure of an inversion logic circuit IV1. In these Figures, reference numeral 20 denotes a p-type semiconductor substrate, 21 denotes a gate oxide film; 22 denotes a polycrystalline silicon layer, 23 denotes an inter-layer insulation film, 24 denotes a metallic wiring layer, 25 denotes an N well, 26 denotes an $n^+$-channel impurity layer serving as either a source or a drain region of an N-channel transistor, 27 denotes a $p^{30}$-channel impurity layer serving as either a source or a drain region of a P-channel transistor, and 28 denotes a contact region.

In the oscillator circuit OSC", the gate insulation film of the transistors N1" and P1" used in the transmission gate TR" is composed of: a gate oxide film 21, which is similar to that of the other transistors used in the same semiconductor integrated circuit device; and part (23") of the inter-layer insulation film 23. With this construction, transistor N1" and/or transistor P1" is allowed to have a gate insulation film thicker than that of the other transistors. Further, the gate electrodes of the transistors N1" and P1" are constituted by part (24") of the metallic wiring layer 24 formed on the inter-layer insulation film 23. In other words, the gate electrodes 24" of the transistors N1" and P1" are formed of a different metallic material from that of the gate electrodes 22 of the other transistors. (In the present embodiment, gate electrodes 24" are formed of aluminum.) The gate oxide film 21 and the inter-layer insulation film 23 are formed of the same material (e.g., $SiO_2$), but are formed in different processes.

The structural difference between the elements shown in FIGS. 2B and 2C lies in the thickness of the insulation film, i.e., the distance between the surface of the semiconductor substrate and the gate electrode. In the case of the inversion logic circuit IV1 shown in FIG. 2B, the thickness $T_{GATE}$ of the gate oxide films of the transistors N2 and P2 is several hundreds of Å, as in the prior art, provided that an ordinary CMOS-LSI manufacturing process is used. In the case of the transmission gate TR", however, not only the gate oxide film 21 (thickness: $T_{GATE}$) but also the inter-layer insulation film 23" (thickness: $T_{ISO}$) is located under the gate electrodes 24" of the transistors N1" and P1". Thus, the total thickness $T_{GATE}(=T_{GATE}+T_{ISO})$ is very large in value; it is in the range of several thousand Å to ten thousand Å. It should be noted that the inter-layer insulation film 23" is formed simultaneously with the inter-layer insulation film 23 (which is formed on the entire substrate surface after the polycrystalline silicon layer 22 is formed), such that the polycrystalline silicon layer 22 (which serves as the gate electrode of the other transistors) is insulated from the metallic wiring layer 24. It should be also noted that the gate electrodes 24" of transistors N1" and P1" are formed simultaneous with the metallic wiring layer 24 (which is used e.g. for connecting the drains of the other transistors). Accordingly, the manufacturing process is in no way complicated as a result of the formation of the transistors N1" and P1".

In the oscillator circuit OSC" of the above embodiment, the thickness of the gate oxide films of the transistors N1" and P1" in the transmission gate TR" can be increased tens of times, as compared to the prior art. Thus, as seen from the equation (1-22), the current amplification factor $\beta$ of the transistors N1" and P1" is reduced to about 1/30 to 1/60.

In addition, as seen from the equation (4-1), the variation in thickness of the gate oxide film of the MOS transistor affects the threshold voltage. The affection on the threshold voltage will now be discussed. The terms in the equation (4-1), which relate to the thickness $T_{GATE}$, may be rearranged as follows:

$$-\frac{T_{GATE}}{\epsilon_{SiO2}}\left\{-\sqrt{2\epsilon_{SiO2}qN_2(2\phi F+|V_{sub}|)}+qN_{SS}+\int_0^{T_{GATE}}\frac{xp_x(x)}{T_{GATE}}dx\right\}$$

Regarding the terms in parentheses {}, the first term represents the density of the space charge caused to appear on the semiconductor surface by $V_{SiO2}$, the second term represents the density of the charge held at a surface level of the interface between the gate oxide film and the surface of the semiconductor substrate, and the third term represents the density of the fixed charge distributed in the gate oxide film and the interlayer insulating film (where $x/T_{GATE}$ denotes that the influence on the threshold voltage Vth decreases the distance from the surface of the semiconductor substrate increases). As has been stated above, no serious error will occur in the value of the threshold value Vth, even if the third term is omitted. Using the representative values of the aforementioned manufacturing parameters, the values of the first and second terms will be found as follows:

($|V_{sub}|=0V$)

First Term $=-8.9\times10^{-8}$ coulomb/cm$^2$

Second Term $\times+1.6\times10^{31\,8}$ coulomb/cm$^2$

Considering the substrate bias effect, the absolute value of the first term further increases. On the other hand, the value of the second term depends on the process of manufacturing the gate oxide layer. By improving the process, the value Nss may decrease; however, it seems that the value of the second term would not increase. Taking the above into consideration, it is considered that the value in the parentheses {} would be negative. From the above, it is understood that the increase of $T_{GATE}$ raises the threshold voltage Vth. This tendency does not contradict a generally accepted idea. In the case of the present invention, $SiO_2$ just above the semiconductor substrate constitutes the same gate oxide film as in the prior art. Thus, the value of the term of Nss does not change. In addition, since the influence of the fixed charge distributed in the interlayer insulating film decreases as the distance increases from the surface of the semiconductor substrate, it is considered that the value in the parentheses {} does not substantially change, compared to the prior art.

From the above, it can be thought that the value of the term in the equation (4-1), which relates to the thickness $T_{GATE}$ of the gate oxide film, is substantially proportional to $T_{GATE}$, and the constant of proportion takes a positive value. Thus, the transistors N1" and P1" in the transmission gate section TR" are provided with threshold values, higher than those in the conventional art.

The following advantages (1) and (2) can be thus obtained: (1) the current amplification factor 62 of each transistor, N1" and P1", decreases in proportion to $T_{GATE}/T_{GATE'}$, and (2) the threshold voltage Vth of each transistor, N1" and P1", increases as $T_{GATE}$ approaches $T_{GATE}$. The channel conductances gn and gp appearing in the equation (2-5) are small than the ratio of $T_{GATE}/T_{GATE'}$.

In this embodiment, it is understood, from the definition of feedback resistance Rfb in the equation (2-1), that the area needed for providing a desired feedback resistance Rfb on the LSI chip can be reduced to about 1/30 to 1/60, compared to the prior art.

Figure 3A:
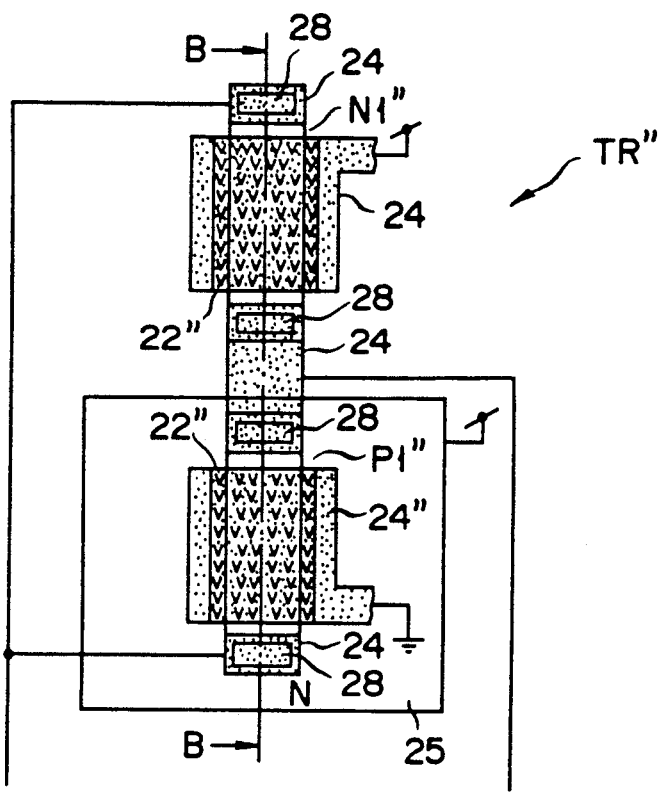
FIG. 3A shows another example of the plan pattern of elements in the oscillator circuit shown in FIG. 1.
Figure 3B:
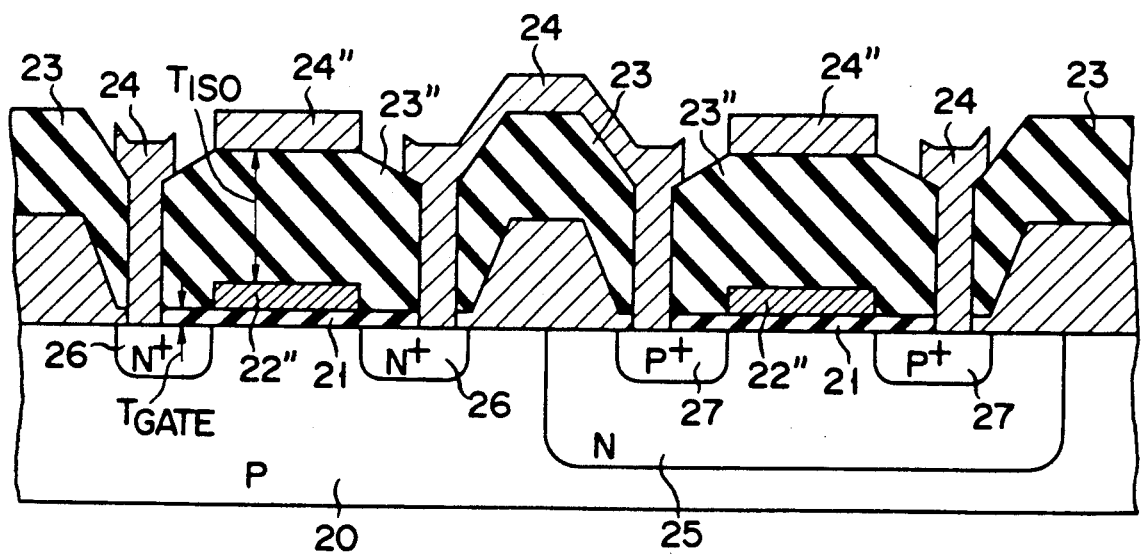
FIG. 3B is a cross-sectional view taken along line B—B in FIG. 3A.

FIG. 3A shows a plan pattern of the transistors N1" and P1" in the transmission gate section TR", according to another embodiment of the present invention. FIG. 3B is a cross-sectional view taken along line B—B in FIG. 3A. The embodiment shown in FIGS. 3A and 3B in FIG. 3A. The embodiment shown in FIGS. 3A and 3B is substantially identical to that shown in FIGS. 2A and 2B, excepting that there is provide a polycrystalline silicon layer 22". The inter-layer insulating film 23" is interposed between the polycrystalline silicon layer 22" and the gate electrode 24 (formed of an aluminum wiring layer). In these embodiments, common structural elements are denoted by the same numerals.

Assuming that $\epsilon_{SiO2}/T_{GATE}\equiv C_{GATE}$, $C_{GATE}$ represents the MOS capacitance per unit area in the embodiment of FIG. 2. On the other hand, in FIG. 3B, the MOS capacitance $C_{GATE''}$ per unit area, which corresponds to $C_{GATE}$, is considered to represent a composite MOS capacitance of MOS capacitance $C_{ISO}$ per unit area and MOS capacitance $C_{GATE}$ per unit area. The MOS capacitance $C_{ISO}$ is provided by forming the inter-layer insulating film 23", as a dielectric element, between the gate electrode 24" formed of an aluminum wiring layer and the electrically floating polycrystalline silicon layer 22". The MOS capacitance $C_{GATE}$ is provided by forming the gate oxide film 21, as a dielectric element, between the polycrystalline silicon layer 22" and the semiconductor substrate 20. If the thickness, expressed by $T_{ISO}$, of the inter-layer insulating film is equal between the embodiment shown in FIG. 2 and that shown in FIG. 3, $C_{GATE}$ is equal to $C_{GATE''}$, as shown below:

$$C_{GATE}" = \left(\frac{1}{C_{GATE}} + \frac{1}{C_{ISO}}\right)^{-1}$$

$$= \left(\frac{T_{GATE}}{\epsilon_{SiO2}} + \frac{T_{ISO}}{\epsilon_{SiO2}}\right)^{-1}$$

$$= \frac{\epsilon_{SiO2}}{T_{GATE} + T_{ISO}}$$

$$= \frac{\epsilon_{SiO2}}{T_{GATE}'}$$

$$= C_{GATE}'$$

On the basis of the equations (1-22), (2-6) and (4-1), it is considered that, in both embodiments shown in FIGS. 2 and 3, the current amplification factor β, threshold voltage Vth, and feedback resistance Rfb are influenced substantially equally.

In the above embodiment, in order to set the channel resistance of the transistors N1" and P1" incorporated in the transmission gate section TR", to a predetermined high value, the thickness of the gate insulating film of each transistor is set higher than that of the gate insulating film of each of other transistors formed in the same semiconductor integrated circuit device. However, the channel resistance of the transistors N1" and P1" can be set to a predetermined high value by making the dosage of ions implanted, for control of threshold, into the formation regions of the transistors N1" and P1", different from the dosage of ions implanted, for control of threshold, into the formation regions of the other transistors.

The inversion operation of the inversion logic circuit may be controlled by an oscillation control signal. Examples of the structure for realizing this control are shown in FIGS. 4A and 4B.

Figure 4A:
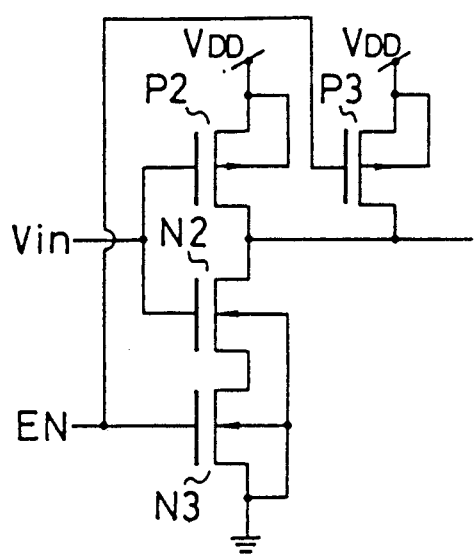
FIGS. 4A and 4B show examples of an inversion logic circuit in the oscillator circuit shown in FIG. 1.

In FIG. 4A, an oscillation input signal Vin and an oscillation control signal EN are supplied to a NAND circuit comprising P-channel transistors P2 and P3 connected in parallel and N-channel transistors N2 an N3 connected in series. The oscillation input signal Vin is input to the gates of the P-channel transistor P2 and the N-channel transistor N2. The oscillation control signal EN is input to the gates of the P-channel transistor P3 and the N-channel transistor N3. When the oscillation control signal EN is in the activated state (at a high ("H") level), the inversion operation can be performed, and the oscillation operation carried out. When the oscillation control signal EN is in the nonactivated state (at a low ("L") level), the inversion operation is disabled, and the output is set at the "H" level. Thus, the oscillation operation is not carried out.

Figure 4B:
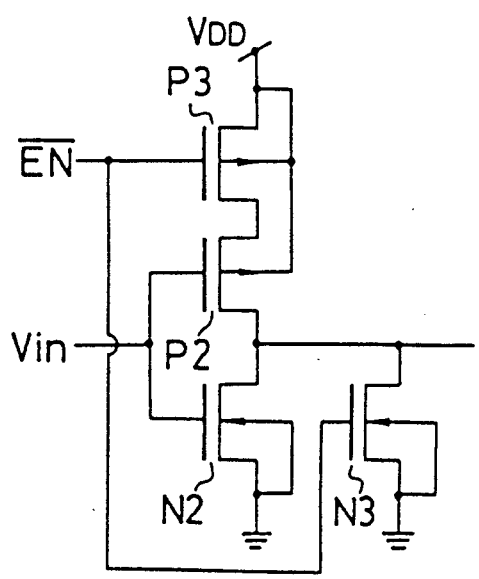

In FIG. 4B, an oscillation input signal Vin and an oscillation control signal EN are supplied to a NOR circuit comprising P-channel transistors P2 and P3 connected in series and N-channel transistors N2 an N3 connected in parallel. The oscillation input signal Vin is input to the gates of the P-channel transistor P2 and the N-channel transistor N2. The oscillation control signal EN is input to the gates of the P-channel transistor P3 and the N-channel transistor N3. When the oscillation control signal EN is in the activated state (at a low ("L") level), the inversion operation can be performed, and the oscillation operation carried out. When the oscillation control signal EN is in the nonactivated state (at a high ("H") level), the inversion operation is disabled, and the output is set at the "L" level. Thus, the oscillation operation is not carried out.

Figure 5:
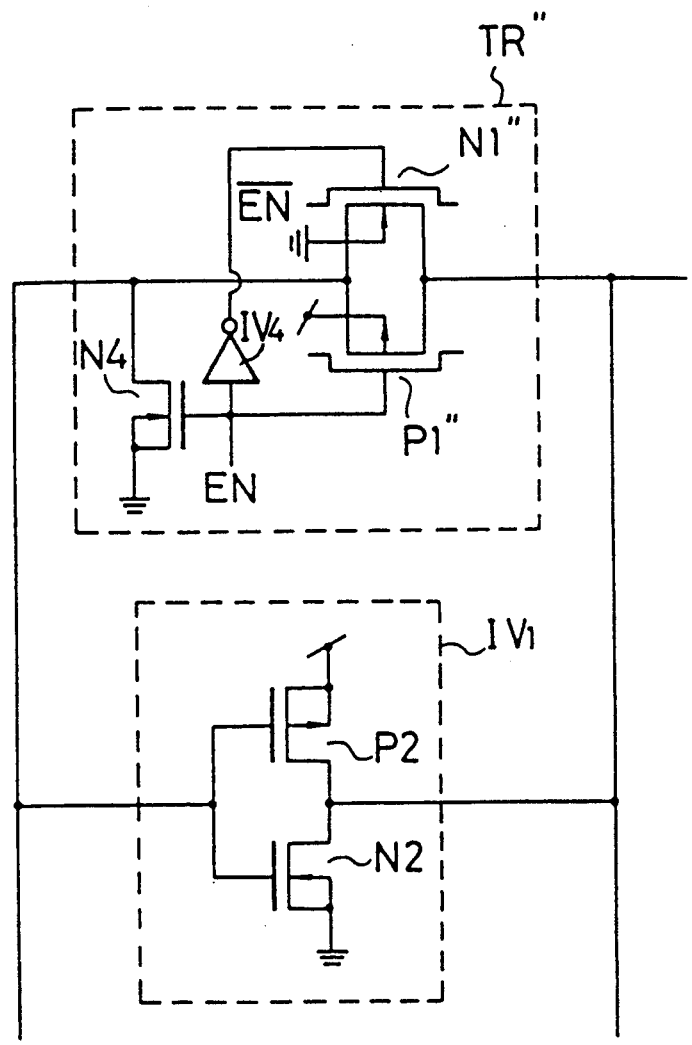
FIG. 5 shows another example of the element in the oscillator circuit shown in FIG. 1.

FIG. 5 shows an example of a circuit wherein the gate potential of the transistor N1" in the transmission gate TR" is made to differ from the gate potential of the transistor P1" by an oscillation control signal, thereby controlling the "ON" and "OFF" states of the transistors N1" and P1". An oscillation control signal EN is supplied to the gate of the transistor P1", and an inverted control signal EN, obtained by inverting the oscillation control signal EN through an inverter IV4, is supplied to the gate of the transistor N1". A pulldown N-channel transistor N4 is connected between one side (the input terminal side of the inversion logic circuit IV1) of the transmission gate TR" and a ground (GND). The oscillation control signal EN is supplied to the gate of the pull-down transistor N4. When the oscillation control signal EN is in the non-activated state (at a low "L" level), the transmission gate TR" is rendered conductive, thus enabling the oscillation operation. When the oscillation control signal EN is in the activated state (at a high "H" level), the transmission gate TR" is rendered non-conductive, thus stopping the oscillation operation. When the transmission gate TR" is in the non-conductive state, the pull-down transistor N4 is turned on. Thus, the potential of said one side (the input terminal side of the inversion logic circuit IV1) of the transmission gate TR" is pulled down to the potential of GND.

In the above embodiment, in order to turn on the Nchannel transistor N1" of the transmission gate TR", a power source voltage having a higher potential was applied to the gate of the transistor N1"; however, a predetermined first potential capable of turning on the N-channel transistor N1" may be applied to the gate of the transistor N1". Similarly, in order to turn on the P-channel transistor P1" of the transmission gate TR", a power source voltage having a lower potential was applied to the gate of the transistor P1"; however, a predetermined second potential capable of turning on the P-channel transistor P1" may be applied to the gate of the transistor P1".

Furthermore, in the above embodiment, the crystal oscillator X'tal was employed. The use of a ceramic oscillator or the like, however, can bring about the same advantages as the above embodiment. More specifically, a piezoelectric tuning fork oscillator can be used.

As has been described above, the present invention provides an oscillator circuit wherein the area occupied in an LSI chip by a transmission gate, which constitutes a feedback resistance, can be remarkably reduced without adversely affecting oscillation characteristics.

In addition, this invention provides an oscillator circuit wherein the thickness of a gate oxide film can be freely increased by a simple method, by using, as a gate insulating and a gate electrode of a transistor used in a transmission gate, an inter-layer insulating film on a gate electrode material and a metal wiring layer on the inter-layer insulating film of other transistor formed in the same semiconductor integrated circuit device.

What is claimed is:

1. An oscillator circuit incorporated in a semiconductor integrated circuit and having an oscillation input terminal and an oscillator output terminal to which an external oscillator is connected, said oscillator circuit comprising:

an inverting logic circuit comprising transistors formed on the semiconductor substrate of said semiconductor integrated circuit, connected to receive a signal input through said oscillation input terminal, and adapted to supply an output signal through said oscillation output terminal;

an N-type MOS transistor formed on said semiconductor substrate, and having a source electrode and a drain electrode one of which is connected to said oscillation input terminal, and the other of which is connected to said oscillation output terminal, and a gate electrode which is connected to receive a first potential for turning on the N-type MOS transistor; and a P-type MOS transistor formed on said semiconductor substrate, and having a gate-insulating film, a source electrode and a drain electrode, one of which is connected to said oscillation input terminal, and the other of which is connected to said oscillation output terminal, and a gate electrode which is connected to receive a second potential for turning on the P-type MOS transistor, wherein the gate-insulating film of at least one of said MOS transistors is thicker than those of other MOS transistors formed on said semiconductor substrate.

2. The oscillator circuit according to claim 1, wherein the gate-insulating film of said N-type MOS transistor consists of an insulating film formed simultaneously with the gate-insulating films of the other MOS transistors formed in said semiconductor substrate and an inter-layer insulating film formed on this insulating film, and a metal wiring layer forming said gate electrode is formed on said inter-layer insulating film.

3. The oscillator circuit according to claim 1, wherein the gate-insulating film of said P-type MOS transistor consists of an insulating film formed simultaneously with the gate-insulating films of the other MOS transistors formed in said semiconductor substrate and an inter-layer insulating film formed on this insulating film, and a metal wiring layer forming said gate electrode is formed on said inter-layer insulating film.

4. The oscillator circuit according to claim 2 or 3, wherein said inter-layer insulating film is formed simultaneously with inter-layer insulating films of the other MOS transistors formed on said semiconductor substrate.

5. The oscillator circuit according to claim 1, wherein said inverting logic circuit is enabled in accordance with an oscillation control signal.

6. The oscillator circuit according to claim 1, wherein the gate potentials of said N-type MOS transistor and said P-type MOS transistor are controlled by an oscillation control signal, and said N-type MOS transistor and said P-type MOS transistor are turned on or off at the same time.

7. The oscillator circuit according to claim 1, wherein the gate-insulating film of said N-type MOS transistor consists of a first insulating film formed simultaneously with the gate-insulating films of the other MOS transistors formed in said semiconductor substrate and a second insulating film formed on the first insulating film simultaneously with inter-layer insulating films of said other MOS transistors; a metal wiring layer forming said gate electrode is formed on said second insulating film; and a polycrystalline silicon layer, which is electrically floating, is formed on said first insulating film and in the inter-layer.

8. The oscillator circuit according to claim 1, wherein the gate-insulating film of said P-type MOS transistor consists of a first insulating film formed simultaneously with the gate-insulating films of the other MOS transistors formed in said semiconductor substrate and a second insulating film formed on the first insulating film simultaneously with inter-layer insulating films of said other MOS transistors; a metal wiring layer forming said gate electrode is formed on said second insulating film; and a polycrystalline silicon layer, which is electrically floating, is formed on said first insulating film and in the inter-layer.

* * * * *